United States Patent [19]

Schulte

[11] Patent Number: 5,113,076
[45] Date of Patent: May 12, 1992

[54] TWO TERMINAL MULTI-BAND INFRARED RADIATION DETECTOR

[75] Inventor: Eric F. Schulte, Santa Barbara, Calif.

[73] Assignee: Santa Barbara Research Center, Goleta, Calif.

[21] Appl. No.: 452,891

[22] Filed: Dec. 19, 1989

[51] Int. Cl.⁵ .......................... G01J 1/00; G01T 1/24; H01L 25/00; H01L 31/00
[52] U.S. Cl. ................. 250/370.06; 250/330; 250/332; 250/370.01; 250/370.12; 357/30; 357/32
[58] Field of Search ............... 250/370.06, 370.12, 250/330, 332, 349, 370.01; 357/30 B, 30 E, 32, 30 D

[56] References Cited

U.S. PATENT DOCUMENTS

| | | | |
|---|---|---|---|
| 3,532,945 | 10/1970 | Weckler | 357/30 D |
| 4,278,986 | 7/1981 | Mader | 357/30 D X |
| 4,366,496 | 12/1982 | Jaecklin | 357/30 D X |
| 4,753,684 | 6/1988 | Ondris et al. | 136/258 |
| 4,847,489 | 7/1989 | Dietrich | 250/226 |
| 4,885,619 | 12/1989 | Kosai | 357/24 |

FOREIGN PATENT DOCUMENTS 55-101832 8/1980 Japan ............... 250/370.06

OTHER PUBLICATIONS

J. M. Pawlikowski and P. Becla, "Some Properties of Photovoltaic $Cd_xHg_{1-x}Te$ Detectors for Infrared Radiation," *Infrared Physics*, vol. 15 (1975), pp. 331-337.

Primary Examiner—Stephen C. Buczinski
Attorney, Agent, or Firm—W. C. Schubert; W. K. Denson-Low

[57] ABSTRACT

A radiation detector 10 includes a first heterojunction 14A and a second heterojunction 16A electrically coupled together in series between a first electrical contact 18 and a second electrical contact 20. The detector comprises at least a three regions or layers including a first layer 12 having a first type of electrical conductivity, a second layer 14 having a second type of electrical conductivity, and a third layer 16 having the first type of electrical conductivity. The first and second heterojunctions are coupled in series and function electrically as two back-to-back diodes. During use the detector is coupled to a switchable bias source 22 that includes a source of positive bias (+Vb) 22A and a source of negative bias (−Vb) 22B. With +Vb applied across the detector the first heterojunction is in far forward bias and functions as a low resistance conductor, thereby contributing no significant amount of photocurrent to the circuit. The second heterojunction is in a reverse bias condition and modulates the circuit current in proportion to the photon flux of an associated spectral region or color. Conversely, with −Vb applied across the detector the second heterojunction is in forward bias and contributes no significant photocurrent to the circuit while the first heterojunction is reversed biased and produces a current modulation proportional to the flux incident thereon, the flux being associated with a different spectral region.

22 Claims, 4 Drawing Sheets

TWO TERMINAL MULTI-BAND INFRARED RADIATION DETECTOR

FIELD OF THE INVENTION

This invention relates generally to detectors of radiation and, in particular, to a two terminal semiconductor photovoltaic radiation detector responsive to infrared radiation (IR) within at least two spectral bands.

BACKGROUND OF THE INVENTION

Radiation detectors, such as Group II-VI detectors of IR radiation, generally are characterized as having an energy bandgap that is suitable for absorbing radiation within a single spectral region. As such, a capability to detect, with a single detector, radiation within more than one spectral region is a desirable goal. However, presently available technology for realizing this function is less than optimum. For example, two separate focal planes can be provided in conjunction with an optical device for spectrally splitting an incident radiation beam, thereby directing a portion of the beam to each of the focal planes. However, this approach requires relatively complicated optical devices and optical alignment and further requires the expense associated with two focal planes of radiation detectors.

Another approach involves a wedge filter for spectrally dispersing an incident radiation beam. However, the wedge filter is relatively difficult to fabricate and align and does not provide spatial concurrency of detected radiation. Furthermore, the wedge filter approach is not amenable to the fabrication of a staring-type radiation detecting array.

Another approach involves a binary optic spectral spreading technique. However, this technique requires a separate connection, typically an indium bump, for each detected spectral region (or color). This approach also requires a separate readout cell for each detected color. Also, the alignment and patterning of the required binary optic pattern is difficult to accomplish and may result in a reduced yield.

It is thus an object of the invention to provide method and apparatus for sensing more than one spectral band of radiation with a single radiation detector.

It is another object of the invention to provide method and apparatus for sensing at least two spectral bands with a single two-terminal radiation detector.

It is one further object of the invention to provide a two-terminal radiation detecting device and an array of same responsive to at least two discrete IR spectral bands.

SUMMARY OF THE INVENTION

The foregoing problems are overcome and the objects of the invention are realized by a radiation detector that includes a first p-n junction and a second p-n junction electrically coupled together in series between a first electrical contact and a second electrical contact. The detector includes at least three regions or layers including a first layer having a first type of electrical conductivity, a second layer contacting the first layer, the second layer having a second type of electrical conductivity, and a third layer contacting the second layer, the third layer having the first type of electrical conductivity. The two heterojunctions are coupled in series and function electrically as two back-to-back diodes. During use the detector is coupled to a switchable bias source that includes a source of positive bias (+Vb) and a source of negative bias (−Vb). With +Vb applied across the detector the first heterojunction is in far forward bias and functions as a low resistance conductor, thereby contributing no significant amount of photocurrent to the circuit. The second heterojunction however is in a reverse bias condition and modulates the circuit current in proportion to the photon flux of an associated spectral region or color. Conversely, with −Vb applied across the detector the second heterojunction is in forward bias and contributes no significant photocurrent to the circuit while the first heterojunction is reversed biased and produces a current modulation proportional to the flux incident thereon, the flux being associated with a different spectral region.

In an illustrative embodiment the detector is comprised of HgCdTe and includes an n-type base layer having an energy bandgap responsive to mid-wavelength IR (MWIR) radiation. Above the base layer is a heavily doped p-type short-wave IR (SWIR) responsive layer. The p-type layer forms a heterojunction with the base layer but does not contribute significant numbers of SWIR photon-generated carriers since most SWIR photons do not penetrate through the base layer. Above the SWIR layer is provided an n-type long-wave IR (LWIR) responsive layer. The LWIR layer is provided with a thickness great enough to absorb the LWIR radiation that has penetrated the two underlying layers. Another heterojunction is thereby formed between the LWIR and SWIR layers, the heterojunction responding substantially only to LWIR radiation.

A one or two-dimensional array of the detectors may be fabricated as mesa-type or as planar-type devices. Additional regions of material may be provided for producing additional heterojunctions resulting in a device responsive to three or more spectral regions.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

The invention is described below in the context of a presently preferred embodiment of a back-side illuminated semiconductor radiation detector comprised of $Hg_{(1.0-x)}Cd_xTe$. It should be realized however that the invention can be practiced with radiation detectors comprised of other Group II-VI materials. The invention can also be practiced with detectors comprised of Group III-V materials such as GaAs, GaAlAs and InP and also with Si devices such as Si doped with Platinum. In general, the teaching of the invention is applicable to photovoltaic radiation detectors comprised of a semiconductor material wherein different energy bandgaps are provided such as by selectively doping or growing the material.

Figure 1:
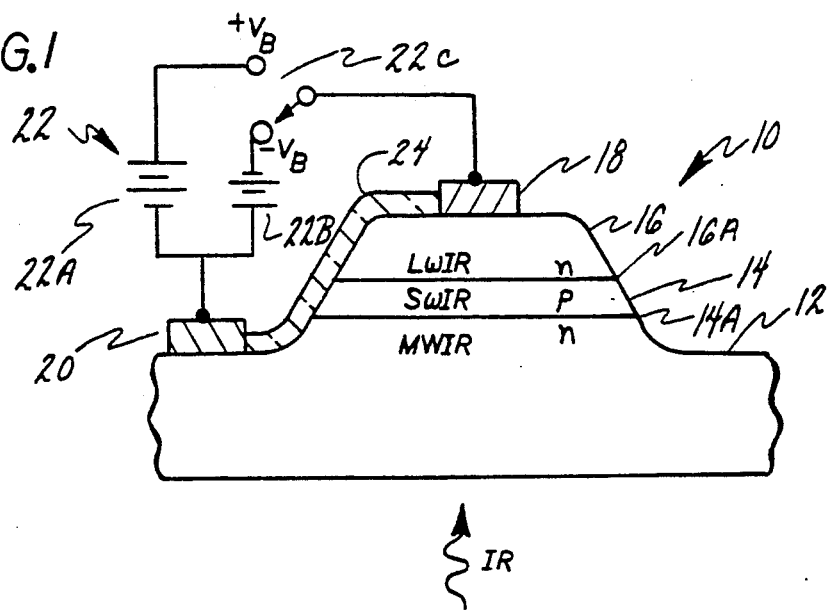
FIG. 1 is an illustrative cross-sectional view of one embodiment of a radiation detector constructed and operated in accordance with the invention.

Referring to FIG. 1 there is illustrated a two-terminal triple layer heterojunction (TLHJ) semiconductor radiation detector 10 that is constructed and operated in accordance with the invention. Detector 10 is comprised of $Hg_{(1.0-x)}Cd_xTe$ and includes an n-type base layer 12 having an energy bandgap responsive to mid-wavelength IR (MWIR) radiation. Above layer 12 is a heavily doped p-type short-wave IR (SWIR) responsive layer 14. Layer 14 forms a heterojunction 14a with the base layer 12, but does not contribute significant numbers of SWIR photon-generated carriers since most SWIR radiation does not penetrate through the base layer 12. In this regard a filter (not shown) may be used at the radiation admitting backside surface of the detector 10 to eliminate any SWIR-related response in the base layer 12. Thus, junction 14a is responsive to substantially only MWIR radiation. Above the SWIR layer 14 is provided an n-type long-wave IR (LWIR) responsive layer 16. LWIR layer is provided with a thickness great enough to absorb the LWIR radiation that has penetrated the two underlying layers and 14. A heterojunction 16a is formed between layers 4 and 16, the heterojunction 16a responding substantially only to LWIR radiation.

As used herein SWIR radiation is considered to include a spectral region extending from approximately 1000 nm to approximately 4000 nm. MWIR radiation is considered to include a spectral region extending from approximately 3000 nm to approximately 8000 nm and LWIR radiation is considered to include a spectral region extending from approximately 7000 nm to approximately 14000 nm. VLWIR radiation is considered to include a spectral region extending from approximately 12000 nm to approximately 20000 nm.

By example, n-type MWIR responsive base layer 12 is comprised of $Hg_{0.7}Cd_{0.3}Te$ having a thickness of approximately 80,000 nm. Base layer 12 is doped with Indium at a concentration of approximately $2 \times 10^{15}$ $cm^{-3}$. P-type SWIR responsive layer 14 is comprised of $Hg_{0.6}Cd_{0.4}Te$ having a thickness of approximately 3000 nm. P-type SWIR responsive layer 16 is doped with Arsenic at a concentration of approximately $1 \times 10^{17}$ $cm^{-3}$. The n-type LWIR responsive layer 16 is comprised of $Hg_{0.8}Cd_{0.2}Te$ having a thickness of approximately 6000 nm. N-type LWIR responsive layer 16 is also doped with Indium at a concentration of approximately $2 \times 10^{15}$ $cm^{-3}$. The layers 12, 14 and 16 may be grown by LPE, VPE, MOCVD or by any suitable process.

The multi-layered detector 10 described thus far is provided with an electrical contact in the form of a nickel pad having an Indium bump 18 formed thereon and a base contact 20 comprised of nickel or any suitable electrical conductor. Contacts 18 and 20 may be formed by conventional photolithographic processes. Typically a plurality of the detectors 10 are provided as a one or a two-dimensional array of detectors, such as a focal plane array (FPA), and during use are coupled to bias and readout circuitry via the contacts 18 and 20.

In the three layer detector 10 the two heterojunctions 14A and 16A are coupled in series and function electrically as two back-to-back diodes. During use the detector 10 is coupled to a switchable bias source 22 that includes a source 22A of positive bias (+Vb) and a source 22B of negative bias (−Vb). Sources 22A and 22B are illustrated schematically as batteries for convenience. Sources 22A and 22B are each coupled to a switching device 22C, such as a transistor switch, for applying either +Vb or −Vb across the detector 10.

With the positive bias +Vb applied across the detector 10 the n-p junction 16A is in far forward bias and functions as a low resistance conductor, thereby contributing no significant amount of photocurrent to the circuit. Junction 14A, however, is in a reverse bias condition and modulates the circuit current in proportion to the MWIR photon flux.

Conversely, with the negative bias −Vb applied across the detector 10 the junction 14A is in forward bias and contributes no significant photocurrent to the circuit. Junction 16A is reversed biased and produces a current modulation proportional to the LWIR flux incident on the detector 10. The modulated current is read out in a conventional manner via the contacts 18 and 20 to a readout circuit (not shown).

Figure 4A:
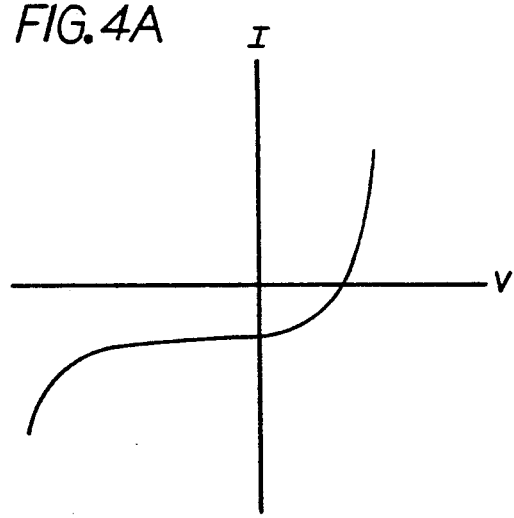
FIGS. 4A, 4B and 4C are I-V graphs showing electrical performance characteristics of a two terminal radiation detector constructed and operated in accordance with the invention.
Figure 4B:
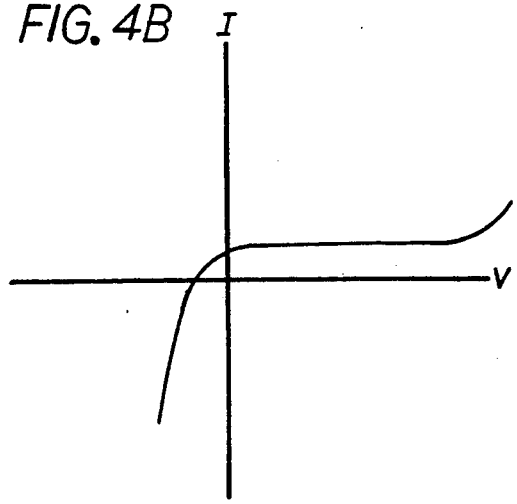
Figure 4C:
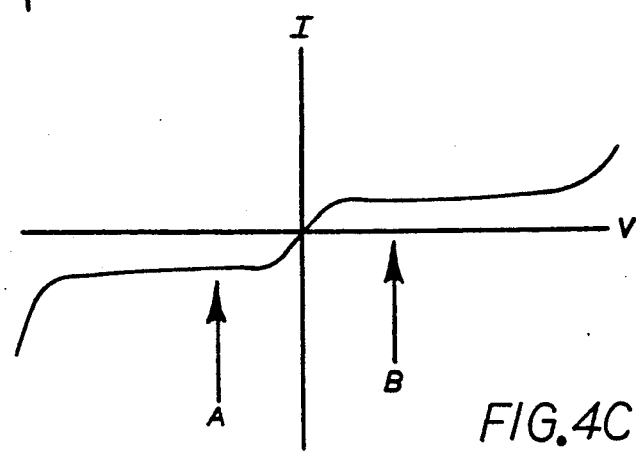

FIG. 4A illustrates the current-voltage (I-V) characteristic of junction 16A, FIG. 4B illustrates the I-V characteristic of junction 14A while FIG. 4C illustrates the combines junction 14A and 16A I-V characteristic. The designation A indicates one bias point suitable for reading out the junction 16A photoresponse while maintaining junction 14A in far forward bias. The designation B indicates one bias point suitable for reading out the junction 14A photoresponse while maintaining junction 16A in far forward bias.

Figure 2:
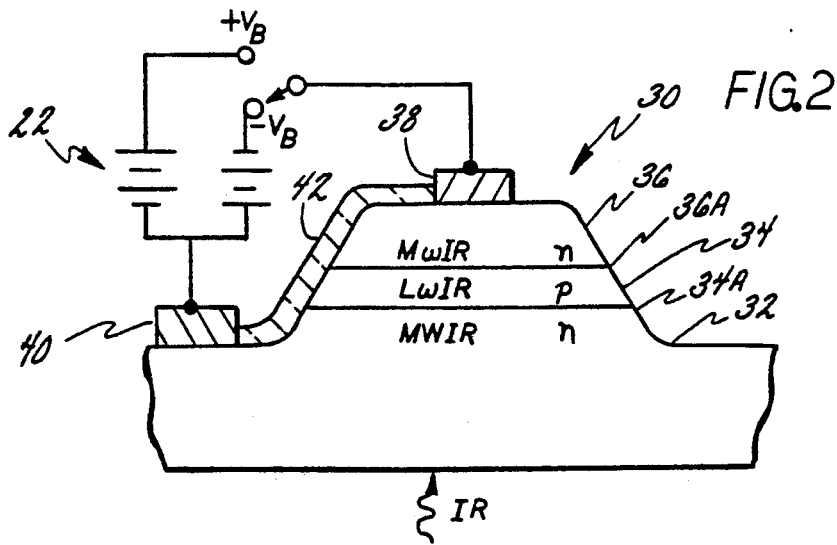
FIG. 2 is an illustrative cross-sectional view of another embodiment of a radiation detector constructed and operated in accordance with the invention.

The above described embodiment illustrates the operation of a MWIR/LWIR "two-color" radiation detector device. However, other choices of semiconductor layer cutoff energy bandgap provide other responses. For example, a MWIR/LWIR/MWIR detector is illustrated in FIG. 2 and provides MWIR and LWIR modulated current from junction 34A and LWIR modulated current only from junction 36A. A LWIR/MWIR/VLWIR detector (not shown) provides a two color response similar to the embodiment of FIG. 1 but in different radiation bands. As such, it can be realized that the teaching of the invention is applicable to the construction of radiation detectors having a variety of desirable response characteristics.

Figure 3A:
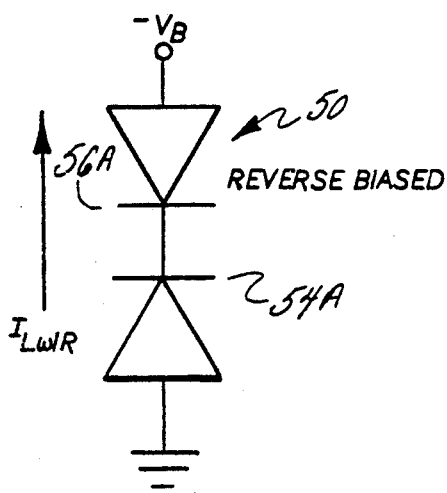
FIGS. 3A and 3B are schematic representations of the detector of FIG. 3.
Figure 3B:
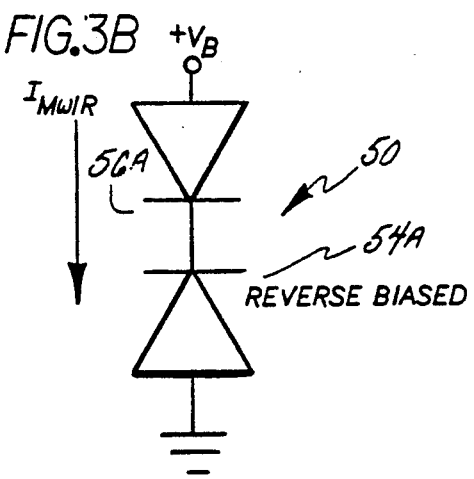

The teaching of the invention is also applicable whether the radiation detector has an n-p-n or p-n-p polarity. The selection of an n-p-n structure is a presently preferred embodiment and is advantageous in that substantially all exposed surfaces of the detector are preferably passivated with a wide bandgap Group II-VI passivation layer, such as the partially shown layers 24 (FIG. 1) and 42 (FIG. 2) comprised of CdTe. A CdTe passivation layer also tends to exhibit a positive fixed charge. The critical n-type detector surfaces are thus maintained in accumulation, a desirable condition for these less heavily doped layers. The intervening p-type layer (14 or 34) is preferably doped to a relatively high level where the positive charge from the overlying passivation layer 24 or 42 does not significantly affect performance. If instead a negatively charged passivation is employed then a p-n-p structure may be more desirable. Such a p-n-p structure is shown in FIGS. 3, 3A and 3B and is described in detail below.

Figure 3C:
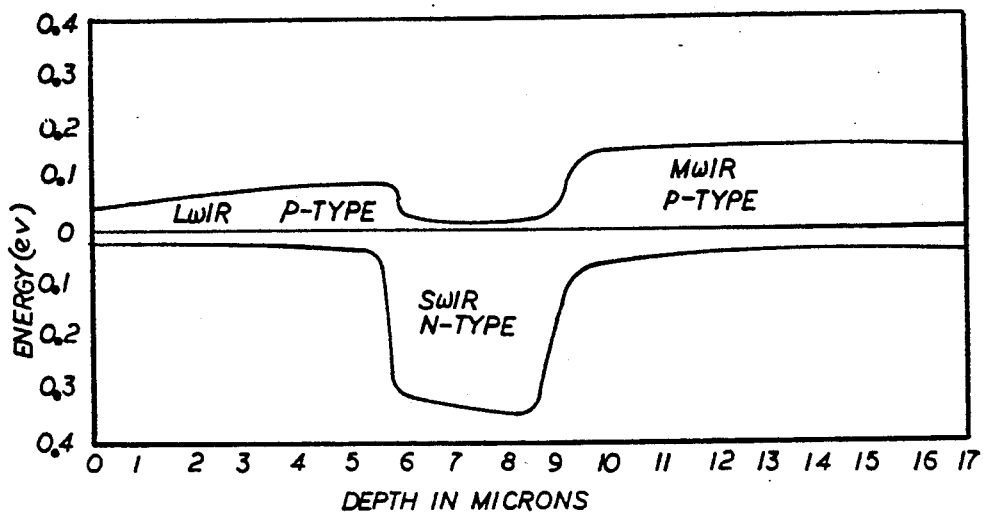
FIGS. 3C and 3D are graphs showing various operational characteristics of the radiation detector of FIG. 3.
Figure 3D:
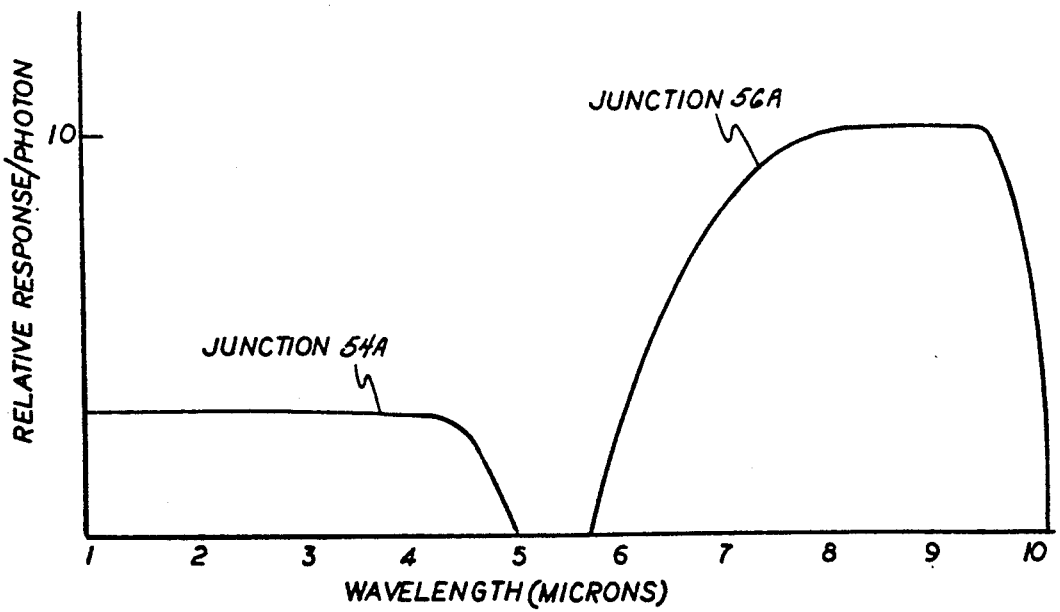
Figure 3:
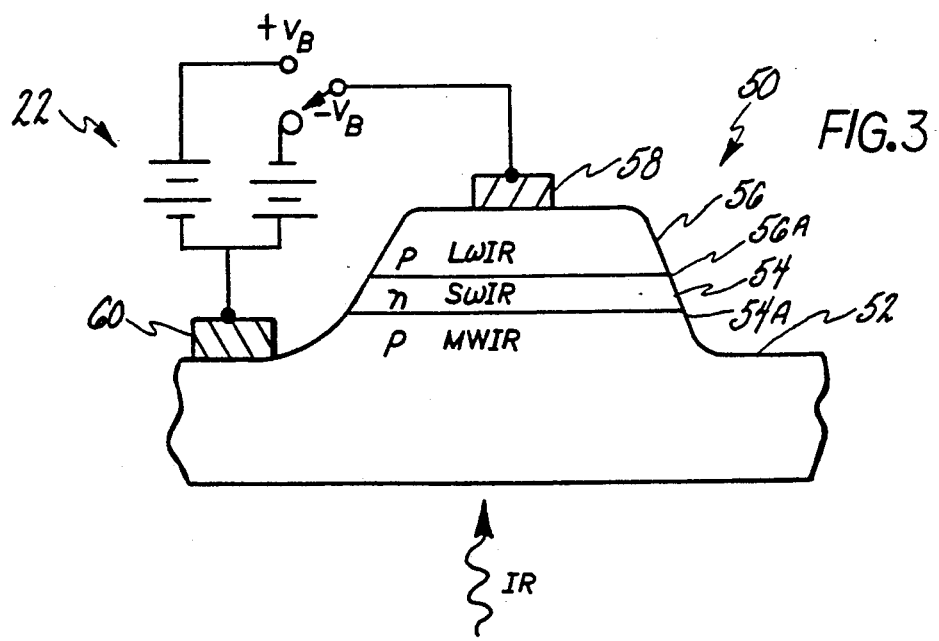
FIG. 3 is an illustrative cross-sectional view of one further embodiment of a radiation detector constructed and operated in accordance with the invention.

FIG. 3 illustrates another embodiment of a triple layer heterojunction detector 50 that includes a first color LWIR-SWIR p-n junction 56A and a second color MWIR-SWIR p-n junction 54A. By reversing the polarity, or by changing the magnitude, of the applied bias one junction is reversed biased (active) and the other junction is forward biased (inactive). As such the signal output of the detector 50 is caused to alternate between the two colors as the bias polarity is reversed. This aspect of the operation of detector 50 is shown in the simplified schematic diagrams of FIGS. 3A and 3B.

In accordance with the invention this responsivity to two spectral bands or colors is achieved with a single radiation detector and with only one Indium bump per detector element or pixel. That is, a multi-color detector is provided wherein each detector element functions electrically as a relatively simple two-terminal device. As such, for an array of detectors constructed in accordance with the invention producibility is enhanced resulting in greater device yield and a reduced cost.

FIG. 3C is an illustrative spatial energy band diagram of an embodiment of the detector 50 while FIG. 3D illustrates a desired combined spectral response.

Figure 5:
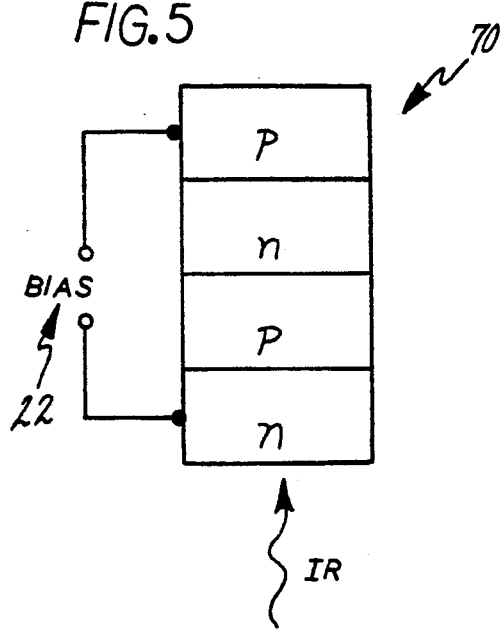
FIG. 5 shows yet a further embodiment of a radiation detector of the invention.

It is also within the scope of the invention to provide additional semiconductor regions or layers as is illustrated in the p-n-p-n detector 70 of FIG. 5. In this illustrative embodiment there is one n-p junction and two p-n junctions coupled in series. Discrimination between the two p-n junctions is achieved by providing one of the p-n junctions with a relatively low potential reverse breakdown, whereas the other p-n junction is provided with a relatively higher potential reverse breakdown characteristic. By biasing with a voltage potential less than the lower breakdown potential, photocurrent from the highest impedance junction is read out. When biased beyond the lower breakdown potential only the higher breakdown potential junction modulates the photocurrent.

Figure 6:
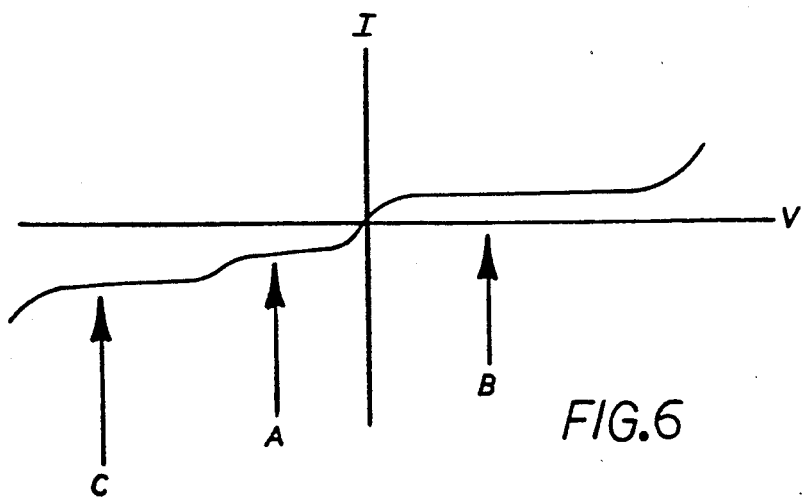
FIG. 6 is a representative I-V diagram showing the optimum biasing points for the detector of FIG. 5.

This is illustrated in FIG. 6 wherein the bias points A and B of FIG. 4C are shown in addition to a bias point C. The bias points A and C are each associated with one of the two p-n junctions and permit the differentiation therebetween.

Figure 7:
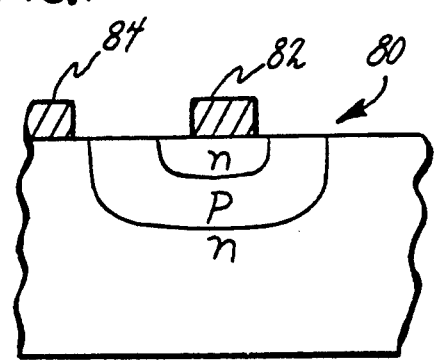
FIG. 7 is a representative cross-sectional view of a planar-type device also constructed and operated in accordance with the invention.

The invention has been described thus far in the context of a mesa-type device. However, it should be realized that the teaching of the invention may also be realized in the context of a planar-type structure. A planar-type n-p-n device 80 is illustrated in cross-section in FIG. 7 and may be fabricated by, for example, a diffusion or an implant/anneal process to form a plurality of heterojunctions coupled in series between a first electrical terminal 82 and a second electrical terminal 84. If desired, the detector 80 may be fabricated instead as a p-n-p device.

Thus, while the invention has been particularly shown and described with respect to presently preferred embodiments thereof, it will be understood by those skilled in the art that changes in form and details may be made therein without departing from the scope and spirit of the invention.

What is claimed is:

1. A radiation detector comprising a first region of semiconductor material having a first type of electrical conductivity and an energy bandgap responsive to radiation in a first spectral region, a second region of semiconductor material in contact with the first region of semiconductor material, the second region of semiconductor material having a second type of electrical conductivity, and a third region of semiconductor material in contact with the second region of semiconductor material, the third region of semiconductor material having the first type of electrical conductivity and an energy bandgap responsive to radiation in a second spectral region of longer wavelength than that of said first region; and further comprising first and second electrical contacts between which said first, second and third regions form first and second p-n junctions electrically coupled back-to-back in series.

2. A detector as set forth in claim 1 wherein the first and third regions are n-type regions and wherein the second region is a p-type region.

3. A detector as set forth in claim 1 wherein the first and the third regions are p-type regions and wherein the second region is an n-type region.

4. A detector as set forth in claim 1 and further comprising a fourth region of semiconductor material in contact with the third region of semiconductor material, the fourth region of semiconductor material having the second type of electrical conductivity.

5. A detector as set forth in claim 1 wherein the detector is responsive to IR radiation within at least two spectral regions selected from a group consisting of SWIR radiation, MWIR radiation, LWIR radiation and VLWIR radiation.

6. A detector as set forth in claim 1 wherein the detector is comprised of material selected from a group consisting of Group II-VI material, Group III-V material, silicon or combinations thereof.

7. A detector as set forth in claim 1 wherein the first and the third regions are comprised of n-type $Hg_{(1.0-x)}Cd_xTe$ material and wherein the second region is comprised of p-type $Hg_{(1.0-x)}Cd_xTe$ material.

8. A detector as set forth in claim 7 wherein the detector further includes a passivation layer overlying external surfaces thereof, the passivation layer being comprised of a Group II-VI material selected to have a wider energy bandgap than an energy bandgap associated with the $Hg_{(1.0-x)}Cd_xTe$ material of the first, the second and the third regions.

9. A radiation detector as in claim 1 further comprising means coupled to said first and second electrical contacts for alternately reverse biasing said first and second p-n junctions.

10. A radiation detector as in claim 1 wherein said second region is essentially transparent to radiation within said second spectral region.

11. A method of detecting radiation within two wavelength regions comprising the steps of:
providing a radiation detector including a first p-n junction and a second p-n junction electrically coupled together back-to-back in series between a first electrical contact and a second electrical contact;
coupling a first bias potential of a first given polarity across the detector between the first electrical contact and the second electrical contact such that the first p-n junction is forward biased and the second p-n junction is reversed biased;

reading out a current signal that is modulated as a function of radiation flux within a first wavelength region;

uncoupling the first bias potential and coupling a second bias potential of a second, opposite polarity across the detector between the first electrical contact and the second electrical contact such that the second p-n junction is forward biased and the first p-n junction is reversed biased; and reading out a current signal that is modulated as a function of radiation flux within a second wavelength region.

12. A method as set forth in claim 11 wherein the step of providing further provides a third p-n junction coupled in series with the first and the second p-n junctions, the method further comprising the steps of:

coupling a third bias potential of the second, opposite polarity across the detector between the first electrical contact and the second electrical contact such that the third p-n junction is reverse biased beyond a breakdown voltage of the first p-n junction; and reading out a current signal that is modulated as a function of radiation flux within a third wavelength region.

13. An array of IR radiation detectors each of which comprises at least a first heterojunction and a second heterojunction electrically coupled together in series between a first electrical contact and a second electrical contact, each of the heterojunctions being responsive to IR radiation within a spectral region of interest for modulating, when reversed biased, a current flow through the detector in accordance with an IR radiation flux density within the spectral region of interest, each detector of the array of detectors including a first volume of semiconductor material comprised of Group II-VI material having a first type of electrical conductivity and an energy bandgap responsive to radiation in a first spectral region of interest, a second volume of semiconductor material comprised of Group II-VI material contacting the first volume, the second volume having a second type of electrical conductivity, and a third volume of semiconductor material comprised of Group II-VI material contacting the second volume, the third volume having the first type of electrical conductivity and an energy bandgap responsive to radiation in a second spectral region of interest.

14. An array of IR radiation detectors as set forth in claim 13 wherein each detector further includes a passivation layer overlying substantially all external surfaces thereof, the passivation layer being comprised of a Group II-VI material selected to have a wider energy bandgap than an energy bandgap associated with the Group II-VI material of the first, the second and the third volumes of Group II-VI semiconductor material.

15. An array of IR radiation detectors as set forth in claim 14 wherein the first volume and the third volume of semiconductor material are each comprised of n-type $Hg_{(1.0-x)}Cd_xTe$, wherein the second volume of semiconductor material is comprised of p-type $Hg_{(1.0-x)}Cd_xTe$ and wherein the passivation layer is comprised of CdTe.

16. An array of IR radiation detectors as set forth in claim 13 wherein the first electrical contact of each of the detectors is switchably coupled between a first bias potential having a positive polarity and a second bias potential having a negative polarity with respect to said second electrical contact.

17. An array of IR radiation detectors as set forth in claim 13 and further comprising a fourth volume of semiconductor material in contact with the third volume, the fourth volume being comprised of Group II-VI material having the second type of electrical conductivity for forming a third heterojunction with the third volume of semiconductor material.

18. An array of IR radiation detectors as set forth in claim 17 wherein the first electrical contact of each of the detectors is switchably coupled between a first bias potential having a first polarity, a second bias potential having the first polarity and a third bias potential having a second polarity opposite that of the first polarity.

19. An array of radiation detectors as set forth in claim 13 wherein the radiation detectors are fabricated as mesa-type devices.

20. An array of radiation detectors as set forth in claim 13 wherein the radiation detectors are fabricated as planar-type devices.

21. An array of radiation detectors as set forth in claim 13 wherein the radiation detectors are responsive to radiation within at least two spectral regions selected from a group consisting of SWIR radiation, MWIR radiation, LWIR radiation and VLWIR radiation.

22. An array of IR radiation detectors as set forth in claim 13 further comprising means coupled to each of said first and second electrical contacts for alternately reverse biasing each of said first and second heterojunctions.

* * * * *